United States Patent
Youm et al.

(10) Patent No.: US 7,035,106 B2
(45) Date of Patent: Apr. 25, 2006

(54) HEAT DISSIPATION SYSTEM FOR SEMICONDUCTOR DEVICE

(75) Inventors: Jang-hyoun Youm, Suwon (KR); Won-ki Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 275 days.

(21) Appl. No.: 10/682,481

(22) Filed: Oct. 10, 2003

(65) Prior Publication Data

US 2004/0095730 A1    May 20, 2004

(30) Foreign Application Priority Data

Nov. 14, 2002  (KR) .................. 10-2002-0070584

(51) Int. Cl.
  *H05K 7/20*     (2006.01)
(52) U.S. Cl. .................. 361/709; 361/704; 361/760; 257/659
(58) Field of Classification Search ........ 361/702–704, 361/709–717, 719–724, 746, 750, 760–762, 361/772, 748; 257/690, 687, 668, 706–727, 257/790; 174/16.1, 16.3, 252, 50.1; 165/80.3, 165/185; 29/840, 842; 228/180.22, 248.1, 228/232, 239, 240, 248
See application file for complete search history.

(56) References Cited

U.S. PATENT DOCUMENTS 5,459,348 A * 10/1995 Smith ................. 257/659
5,640,045 A    6/1997 Krausse, III
6,075,700 A    6/2000 Houghton et al.
6,226,183 B1 * 5/2001 Weber et al. ............ 361/704
6,509,629 B1 * 1/2003 Yoshimatsu et al. ...... 257/660
6,522,555 B1 * 2/2003 Hirano et al. ............ 361/760
6,853,559 B1 * 2/2005 Panella et al. ........... 361/764

FOREIGN PATENT DOCUMENTS

| JP | 9-153590 | 6/1997 |
| JP | 9-312376 | 12/1997 |
| JP | 2000-295839 | 10/2000 |
| KR | 2002-158317 | 5/2002 |
| KR | 2002-51468 | 6/2002 |

* cited by examiner

*Primary Examiner*—Michael Datskovskiy
(74) *Attorney, Agent, or Firm*—Staas & Halsey LLP

(57) ABSTRACT

A heat dissipation system for a semiconductor device having a plurality of semiconductor chips, includes a heat dissipation member which cools the semiconductor chips, an exterior heat dissipation member which is provided opposite to the heat dissipation member, engaged to the semiconductor device and connected to an electrical ground, an electric conductor member which is provided between the heat dissipation member and the exterior heat dissipation member, and electrically connects the heat dissipation member and the exterior heat dissipation member to each other, and a thermal conductivity insulating member which is inserted between the heat dissipation member and the exterior heat dissipation member. Accordingly, the resistance against common mode noise is increased. Furthermore, the heat dissipation efficiency of the semiconductor device is also increased. The head dissipation system improves the heat dissipation efficiency of the semiconductor device to control noise.

21 Claims, 6 Drawing Sheets

HEAT DISSIPATION SYSTEM FOR SEMICONDUCTOR DEVICE

CROSS-REFERENCE TO RELATED APPLICATIONS

This application claims the benefit of Korean Application No. 2002-70584, filed Nov. 14, 2002, in the Korean Intellectual Property Office, the disclosure of which is incorporated herein by reference.

BACKGROUND OF THE INVENTION

1. Field of the Invention

The present invention relates to a semiconductor device, and more particularly, to a heat dissipation system for a semiconductor device, having an improved heat dissipation structure to control noise.

2. Description of the Related Art

Due to the development of a semiconductor technology, a semiconductor electric energy is widely used as, for example, a converted thermal energy, mechanic energy, electric energy or the like by a power device. An active switching device used in semiconductor power devices, such as a BJT (Bipolar Junction Transistor), a FET (Field Effect Transistor) and an IGBT (Insulated Gate Bipolar Transistor), can be on/off according to a user's signal. Recently, an intelligent power module (IPM), or an active power device further including a control chip to control a power device has been developed.

In a switching operation, a self-temperature of a power device is increased by a conduction loss generated due to a parasitic resistor on operation of a switching device and by a switching loss generated due to a switching operation (continual on/off operation). Generally, in order to dissipate heat generated from the conduction loss and the switching loss, a metal plate is attached to one side of the power device to dissipate the heat.

FIG. 5 shows a conventional power converting system including an IPM 10, which is used as a power device, and a control board 50. A metallic base plate 11 is provided in a base side of the power device 10 so as to increase the heat dissipation property. An insulating layer 13 is formed on the base plate 11. A predetermined circuit pattern (not shown) is provided on the insulating layer 13. A plurality of semiconductor chips 14 and 15 are provided according to the predetermined circuit pattern provided on the insulting layer 13. The semiconductor chips 14 and 15 are bonded to one another by wires and are included in the power device.

FIG. 6 shows an inverter circuit comprising a plurality of switching devices 14a, which corresponds to FIG. 5. Each of the switching devices 14a includes an active power device, for example, an IGBT. The inverter circuit further includes a pattern of a control chip 15a which performs a PWM (Pulse Width Modulation) control over a switching operation of the switching devices 14a according to a gate signal. That is, the control chip 15a performs the PWM control and supplies power, which is converted to an intended frequency and voltage by on/off operation of each switching device 14a, to a load (i.e., a motor). The control chip 15 also transmits all kinds of information on the IPM 10 to a control board 50. The information on the IPM 10 includes over current, short-circuit current and overheat information of each switching device 14a, and over voltage and under voltage information of a controlled source. To increase the heat dissipation property of the power device 10, an exterior heat sink 40 is adhered closely to the base plate 11 of the power device 10 by a glue (not shown) and/or screws 12.

Although the base plate 11 of the power device 10 and the exterior heat sink 40 are laid out to be flat, to engage with each other, a predetermined gap is formed therebetween by a manufacturing tolerance, thereby decreasing the heat dissipation efficiency. Thus, an insulating material 30, such as grease, having a high thermal conductivity is filled into the gap formed between the base plate 11 and the exterior heat sink 40. However, the non-conductive grease works as a dielectric, so as to generate a parasitic capacitance 31 between the base plate 11 and the exterior heat sink 40.

Because an interior of the semiconductor power device 10 is laid out to have high insulating resistance, an outside voltage (in the case of a diode) or a gate signal (in the case of an active device) has to be applied so as to perform a switching operation by an on/off operation of the switching devices 14a. However, where noise from a power source, lightning, or other external high voltage is applied to the power device 10, an insulating resistor in the interior of the power device 10 can be broken down, or the switching devices 14a can be operated by a signal distortion, to thereby induce the break down of the power device 10 and a system using the same.

As described above, FIG. 6 illustrates an interior circuit of the IPM 10 and the control board 50 of a power converting system of FIG. 5, and illustrates that three-phase AC power is converted to DC power and the converted DC power is supplied to a three-phase AC servo motor through an inverter. That is, exterior three-phase AC power is supplied from an AC power terminal 60 through an electric wire 61 and is converted to DC power through a rectifying circuit 51 and 52 provided in the control board 50. The converted DC power passes through an inverter circuit including six switching devices 14a of the IPM 10 and is supplied to a terminal 70 of a AC servo motor in a side of the load connected to an output line 71, to thereby drive the motor. An SMPS (Switching Mode Power Supply) 53 and a control circuit 54 provided in the control board 50 control an actuation of the control chip 15a to control the switching devices 14a.

Generally, a ground contact part 41 of the exterior heat sink 40 is connected to a ground line 42 in a side of the power supply and an ground line 43 in a side of the load by screws. Y-capacitor 55 is connected between each electric wire 61 and the ground line 42.

In the above circuit, where a lightning, that is, noise of the power supply (high voltage spike occurring in a relay or a field) or the like, is applied to the electric wire 61 and the output line 71 connected outward, common mode noise occurs. Energy generated by the common mode noise is laid out to pass through the Y-capacitor 55 and to flow off through the grounded exterior heat sink 40 toward the ground line 42 in the side of the power supply, to thereby protect the internal circuit of the power device 10. At this point, capacitance of the Y-capacitors 55 can be increased to increase the tolerance against the noise. However, in this case, the amount of a leakage current is increased. Where the noise-like energy, which does not flow off through the Y capacitors 55, is charged to an internal parasitic capacitance (generated between each switching device 14a and an interior heat dissipation member (not shown)) of the power device 10 and the external parasitic capacitance 31, the switching devices 14a are operated by the lowest electric potential, to thereby enable an erroneous operation of the circuit to be induced. That is, in a switching operation of the power device 10, where two switching devices 14a in an upper and a lower sides of the inverter circuit of FIG. 6 are simultaneously turned on, and thus induce a short circuit of a DC link, the circuit can be broken down.

In the case that the common mode noise occurs, the energy induced by the noise is stored in the parasitic capacitance created in the semiconductor power device, and thus exerts negative effects such as the erroneous operation of the system and/or the circuit breakdown.

SUMMARY OF THE INVENTION

Accordingly, it is an aspect of the present invention to provide a heat dissipation system for a semiconductor device, which removes a parasitic capacitance between a self-heat dissipation member and an exterior heat dissipation member so as increase the resistance against common mode noise.

Additional aspects and advantages of the invention will be set forth in part in the description which follows and, in part, will be obvious from the description, or may be learned by practice of the invention.

To achieve the above and/or other aspects of the present invention, there is provided a heat dissipation system for a semiconductor device having one or more semiconductor chips, comprising a heat dissipation member to cool the semiconductor chips, an exterior heat dissipation member which is provided opposite to the heat dissipation member, engaged to the semiconductor device and connected to a potential of the heat dissipation system, an electrical conductor member which is provided between the heat dissipation member and the exterior heat dissipation member, and electrically connects the heat dissipation member and the exterior heat dissipation member to each other, and a thermal conductivity insulating member which is inserted between the heat dissipation member and the exterior heat dissipation member.

The electrical conductor member may comprise a thin film layer. The thin film layer may include a projection part which is projected from a predetermined position of the thin film layer and contacts with at least one of the heat dissipation member and the exterior heat dissipation member.

The thin film layer may further include an opening part which is provided at a predetermined distance from edges of the thin film layer, and the thermal conductivity insulating member may be accommodated in the opening part.

The thin film layer may be a copper thin film layer. The copper thin film layer may be tinned and may have a thickness of less than 200 μm.

The one or more semiconductor chips may include at least one power switching device.

BRIEF DESCRIPTION OF THE DRAWINGS

These and/or other aspects and advantages of the present invention will become apparent and more readily appreciated from the following description of embodiments thereof, taken in conjunction with the accompanying drawings in which.

DETAILED DESCRIPTION OF THE PREFERRED EMBODIMENTS

Figure 1:
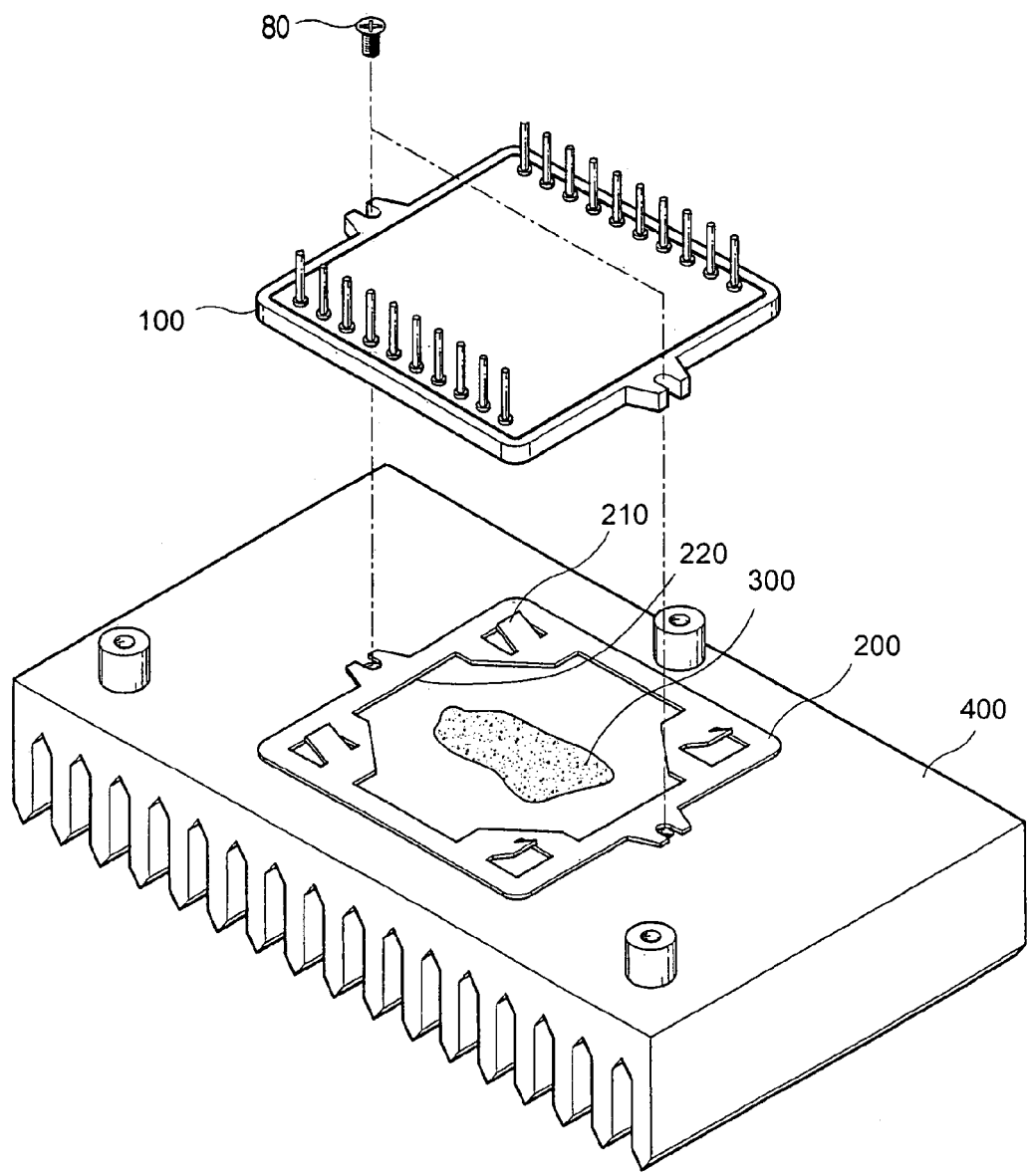
FIG. 1 is a perspective view of a heat dissipation system according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

FIG. 1 shows the configuration of a heat dissipation system according to an embodiment of the present invention. As shown in FIG. 1, the heat dissipation system comprises an IPM 100 including semiconductor chips 140 and 150 (refer to FIG. 2) provided in a case 120 (refer to FIG. 2) thereof, a base plate 110 (refer to FIG. 2) provided so as to cool the IPM 100, an exterior heat sink 400 engaged with the IPM 100 with the base plate 110 provided therebetween, an electric conductor 220 which is interposed between the base plate 110 and the exterior heat sink 400 and electrically connects the base plate 110 and the exterior heat sink 400 to each other, and an thermal conductivity insulating member 300 inserted between the base plate 110 and the exterior heat sink 400.

The IPM 100 including the base plate 110 is engaged to the exterior heat sink 400 by, for example, screws 80, with the electric conductor 200 interposed therebetween, and the thermal conductivity insulating member 300 inserted therebetween. The exterior heat sink 400 includes a ground contact part 410 connected to a power supply side ground line 420 (refer to FIG. 2) and to a load side ground line 430 (refer to FIG. 2). The base plate 110 and the exterior heat sink 400 are made of a high thermal conductivity metal.

The electric conductor 200 is in a form of a thin film plate having a size similar to an external size of the bottom of the case 120. The electric conductor 200 includes one or more projection parts 210 projected from the thin film plate. That is, the projection parts 210 may be formed by cutting predetermined parts of the electric conductor 200, and are respectively provided in, for example, four corners thereof. One side of the electric conductor 200 contacts with the exterior heat sink 400, the projection parts 21 of the other side contacts with the base plate 110. It is understood that the projection parts 21 can be made to be projected from both sides of the electric conductor 200, to thereby contact with the base plate 110 and the exterior heat sink 400.

Accordingly, the exterior heat sink 400 connected to a ground and the base plate 110 of the IPM 100 can be electrically connected to each other. The electric conductor 200 may further include an opening part 200, which is provided at a predetermined distance from side edges of the electric conductor 200. The thermal conductivity insulating member 300 can be accommodated in the opening part 220 of the electric conductor 200.

Figure 3:
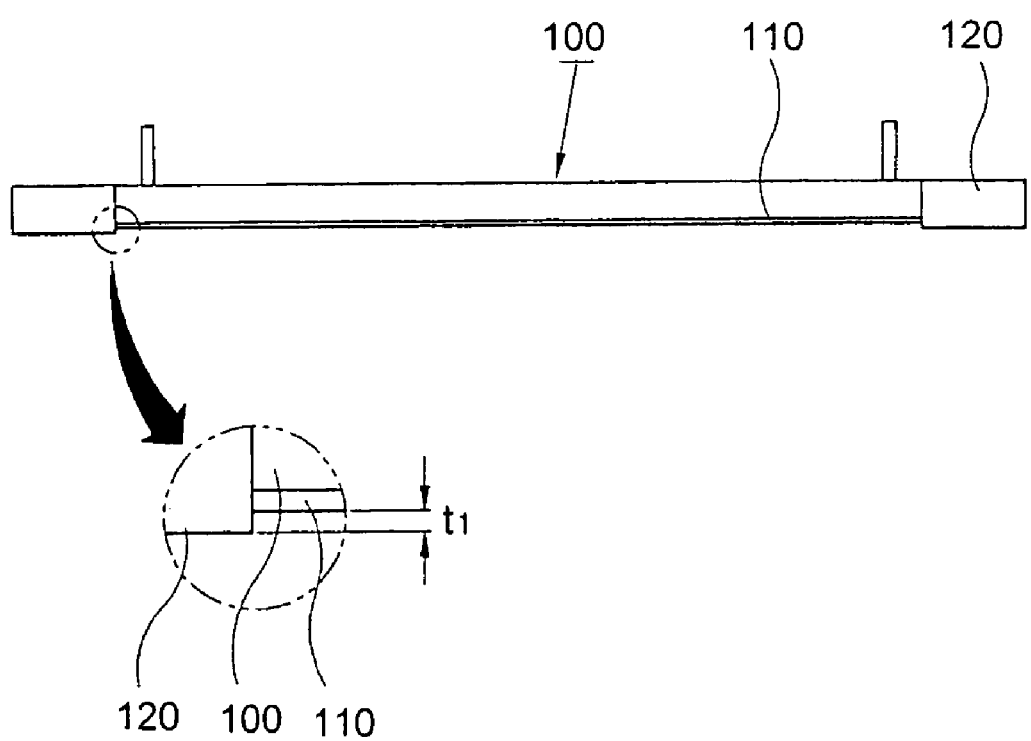
FIG. 3 is a partial enlarged view of a power device according to the present invention.

The thermal conductivity insulating member 30 is provided so as to fill a space formed between the base plate 110 and the exterior heat sink 400. The space is formed between the base plate 110 and the exterior heat sink 400 by the opening part 220 of the electric conductor 200 provided on the exterior heat sink 400. Also, a manufacture tolerance (minute height difference) between the case 120 of the IPM 100 and the base plate 110 may provide a gap t1 (refer to FIG. 3). Where the base plate 110 and the exterior heat sink 400 are engaged, with the electric conductor 200 interposed therebetween, this gap t1 may decrease the heat dissipation property. Thus, the thermal conductivity insulating member 300, for example, grease, which is an insulating material having an excellent thermal conductivity, is inserted into the space formed by the gap t1.

Figure 4:
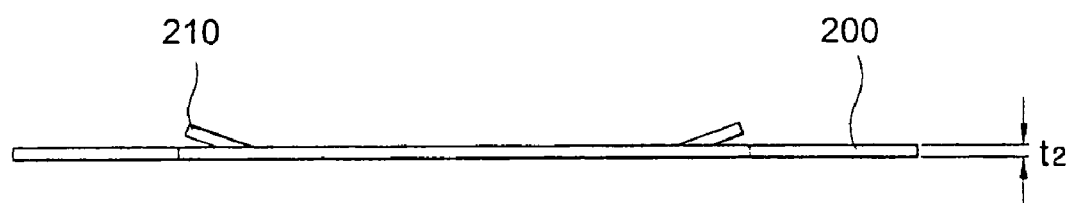
FIG. 4 is an enlarged sectional view of an electric conductor member of FIG. 1.

According to the present invention, a copper, in a form of a thin film, may be used as the electric conductor 200. The electric conductor 200 may be protected from corrosion by tinning. Also, a thickness t2 (refer to FIG. 4) of the thin film electric conductor 200 may be, for example, less than 200 μm.

Figure 2:
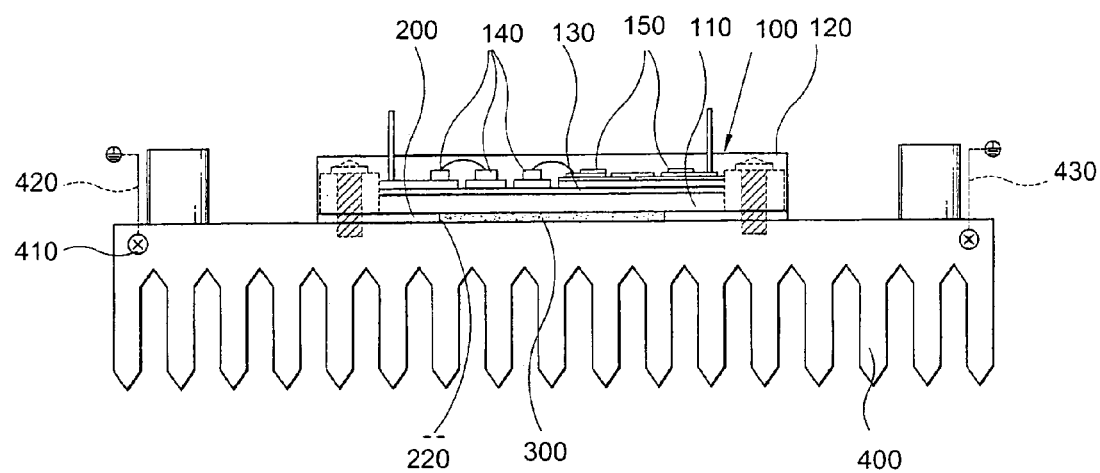
FIG. 2 is a cross sectional view of the heat dissipation system shown in FIG. 1.

FIG. 2 shows a cross sectional view of the heat dissipation system according to the present invention. As shown in FIG. 2, an insulating layer 130 is formed on the metallic base plate 110 which is provided in the base of the IPM 100. A predetermined circuit pattern is provided on the insulating layer 130. According to the predetermined circuit pattern, the plurality of semiconductor chips 140 and 150 are provided thereon. The semiconductor chips 140 and 150 are bonded to one another by wires and are included in the power device. Thus, an inverter circuit comprising a plurality of switching devices 140 is made. The switching devices 140 may include all kinds of active power devices, for example, an IGBT. The inverter circuit also includes a control chip, for example, 150, which controls a switching operation of the switching devices 140 and supplies power, which is converted to have an intended frequency and voltage, to a load (i.e., a motor).

As shown in FIG. 2, the electric conductor 200 is provided on the exterior heat sink 400. The grease, that is, the thermal conductivity insulating member 300, is filled into the space of the opening part 220. The IPM 100 is engaged thereto. Accordingly, the exterior heat sink 400 and the base plate 110 are closely adhered to each other, to thereby increase the heat dissipation efficiency. That is, heat generated from the IPM 100 is conducted to the thermal conductivity insulating member 300 adhered closely to the base plate 110, which is conducted to the exterior heat sink 400 and finally radiated outward.

The base plate 110 and the exterior heat sink 400 are electrically connected to each other by the electric conductor 200 inserted between the base plate 110 and the exterior heat sink 400. Thus, a parasitic capacitance is not generated even though the thermal conductivity insulating member 300 is inserted between the base plate 110 and the exterior heat sink 400.

Figure 5:
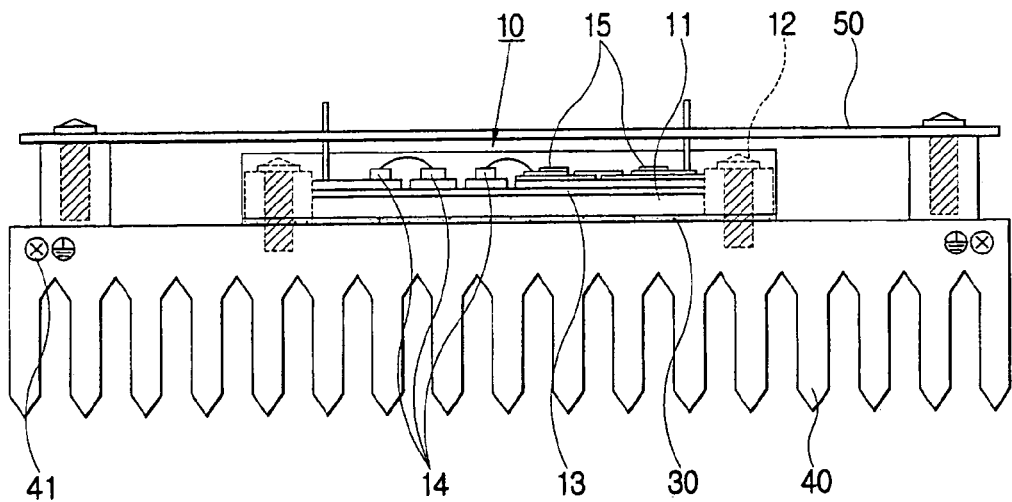
FIG. 5 is a cross sectional view of a conventional heat dissipation system.
Figure 6:
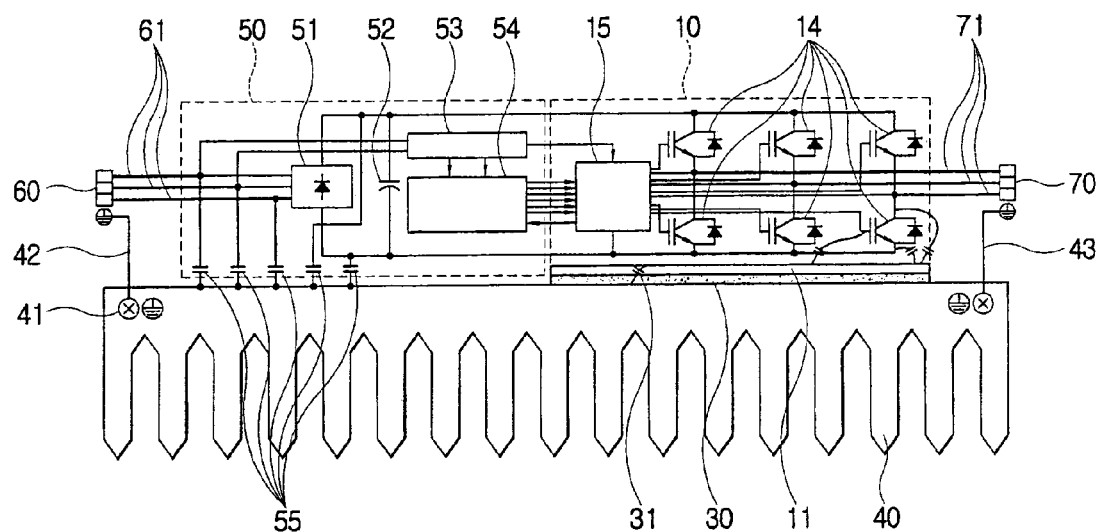
FIG. 6 is a circuit corresponding to the conventional heat dissipation system of FIG. 5.

With the above configuration, even though common mode noise is generated by power supply side noise, lightning, or other exterior high voltage, an exterior parasitic capacitance is not generated between the base plate 110 of the IPM 100 and the exterior heat sink 400. Accordingly, unlike the conventional heat dissipation system shown in FIGS. 5 and 6, a noise energy is not stored in the exterior parasitic capacitance. Thus, the present invention can prevent an erroneous operation of the circuit, or a breakdown of the device by the exterior parasitic capacitance created in the semiconductor power device, where common mode noise is generated.

As described above, according to the present invention, a thin film layer having an electrical conductivity is inserted between an interior heat dissipation member and an exterior heat dissipation member so as to remove a parasitic capacitance, to thereby increase the resistance against common mode noise. Furthermore, a thermal conductor member may be inserted between the interior heat dissipation member and the exterior heat dissipation member, to thereby increase the heat dissipation efficiency of a semiconductor device.

Although a few embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A heat dissipation system for a semiconductor device having one or more semiconductor chips, comprising:
   a heat dissipation member to cool the one or more semiconductor chips;
   an exterior heat dissipation member which is provided opposite to the heat dissipation member, engaged to the semiconductor device and connected to a potential of the heat dissipation system;
   an electrical conductor member which is provided between the heat dissipation member and the exterior heat dissipation member, and electrically connects the heat dissipation member and the exterior heat dissipation member to each other; and
   a thermal conductivity insulating member which is inserted between the heat dissipation member and the exterior heat dissipation member,
   wherein the electric conductor member comprises a thin film layer.

2. The heat dissipation system according to claim 1, wherein the thin film layer includes a projection part which is projected from a predetermined position of the thin film layer and contacts at least one of the heat dissipation member and the exterior heat dissipation member.

3. The heat dissipation system according to claim 2, wherein:
   the thin film layer further includes an opening part which is provided at a predetermined distance from edges of the thin film layer, and
   the thermal conductivity insulating member is accommodated in the opening part.

4. The heat dissipation system according to claim 2, wherein the thin film layer is made of a copper.

5. The heat dissipation system according to claim 2, wherein a thickness of the thin film layer is less than 200μm.

6. The heat dissipation system according to claim 2, wherein the one or more semiconductor chips includes at least one power switching device.

7. The heat dissipation system according to claim 6, wherein the power switching device includes one of a bipolar junction transistor (BJT), a field effect transistor (FET) and an insulated gate bipolar transistor (IGBT).

8. The heat dissipation system according to claim 1, wherein the potential is an electrical ground.

9. The heat dissipation system according to claim 4, wherein the copper thin film layer is tinned.

10. The heat dissipation system according to claim 1, wherein the semiconductor device is a semiconductor power device.

11. The heat dissipation system according to claim 10, wherein the semiconductor power device is one of an intelligent power module (IPM) and an active power device.

12. The heat dissipation system according to claim 1, wherein the heat dissipation member and the exterior heat dissipation member are made of a metal having a high thermal conductivity.

13. A heat dissipation system for a semiconductor device, comprising:

a heat dissipation member provided on the semiconductor device;

an exterior heat dissipation member which is provided opposite to the heat dissipation member, engaged to the semiconductor device and connected to a potential of the heat dissipation system; and an electrical conductor member which is provided between the heat dissipation member and the exterior heat dissipation member, and electrically connects the heat dissipation member and the exterior heat dissipation member to each other, wherein the electrical conductor member removes a parasitic capacitance between the heat dissipation member and the exterior heat dissipation member, wherein the electrical conductor member includes a projection part which contacts at least one of the heat dissipation member and the exterior heat dissipation member the electrical conductor member further includes an opening part, and a thermal conductivity insulating member is accommodated in the opening part.

14. The heat dissipation system according to claim 13, wherein the electrical conductor member removes the parasitic capacitance so as to increase a resistance against common mode noise.

15. The heat dissipation system according to claim 13, further comprising a thermally conductive insulating member which is inserted between the heat dissipation member and the exterior heat dissipation member.

16. The heat dissipation system according to claim 15, wherein the electrical conductor member and the thermally conductive insulating member increase a heat dissipation efficiency of the semiconductor device so as to control noise.

17. The heat dissipation system according to claim 13, wherein the potential is an electrical ground.

18. The heat dissipation system according to claim 13, wherein the semiconductor device includes one or more semiconductor chips having at least one power switching device.

19. A heat dissipation system for a semiconductor device, comprising:

a heat dissipation member;

an exterior heat dissipation member which is connected to a potential of the heat dissipation system; and an electrical conductor member having an electrical conductivity provided between the heat dissipation member and the exterior heat dissipation member, wherein the electric conductor member comprises a thin film layer.

20. The heat dissipation system according to claim 19, wherein the electrical conductor member removes a parasitic capacitance between the heat dissipation member and the exterior heat dissipation member so as to increase a resistance against noise.

21. The heat dissipation system according to claim 19, further comprising a thermally conductive insulating member which is inserted between the heat dissipation member and the exterior heat dissipation member.

* * * * *

UNITED STATES PATENT AND TRADEMARK OFFICE
CERTIFICATE OF CORRECTION

PATENT NO.          : 7,035,106 B2                                        Page 1 of 1
APPLICATION NO. : 10/682481
DATED                  : April 25, 2006
INVENTOR(S)         : Jang-hyoun Youm et al.

It is certified that error appears in the above-identified patent and that said Letters Patent is hereby corrected as shown below:

On Title Page Item (57) (Abstract) Line 16 change "head" to --heat--.

Column 7, Line 18 after "member" insert --,--.

Signed and Sealed this

Twenty-eighth Day of November, 2006

JON W. DUDAS
*Director of the United States Patent and Trademark Office*